(12) United States Patent
Jung et al.

(10) Patent No.: US 6,316,565 B1
(45) Date of Patent: *Nov. 13, 2001

(54) AMIDE- OR IMIDE-INTRODUCED COPOLYMER, PREPARATION THEREOF AND A PHOTORESIST COMPRISING THE SAME

(75) Inventors: Jae Chang Jung; Chi Hyeong Roh, both of Kyungki-do (KR)

(73) Assignee: Hyundai Electronics Industries Co., Ltd., Ichon-shi (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/896,768

(22) Filed: Jul. 18, 1997

(30) Foreign Application Priority Data

Dec. 31, 1996 (KR) .................................................. 96-80265

(51) Int. Cl.[7] ...................................................... C08F 22/40
(52) U.S. Cl. .......................... 526/262; 526/259; 526/113; 526/142; 526/169
(58) Field of Search ..................................... 526/262, 259, 526/113, 169, 142

(56) References Cited

U.S. PATENT DOCUMENTS

| | | |
|---|---|---|
| 3,370,047 | 2/1968 | Raines . |
| 4,011,386 | 3/1977 | Matsumoto et al. . |
| 4,106,943 | 8/1978 | Ikeda et al. . |
| 5,064,919 * | 11/1991 | Hara et al. ............................ 526/169 |
| 5,278,214 | 1/1994 | Moriya et al. . |
| 5,585,219 | 12/1996 | Kaimoto et al. . |

FOREIGN PATENT DOCUMENTS

| | | |
|---|---|---|
| 128164 | 11/1977 | (DE) . |
| 0 789 278 A2 | 8/1997 | (EP) . |
| 2 695 540 | 12/1992 | (FR) . |
| 2699540 * | 6/1994 | (FR) . |
| 2 320 501 A | 6/1998 | (GB) . |
| 2 003 404 | 6/1988 | (JP) . |
| 05 297 591 | 11/1993 | (JP) . |
| WO 97/33198 | 9/1997 | (WO) . |

OTHER PUBLICATIONS

Wallow, Thomas I., et al., "Evaluation of Cycloolefin–Maleic Anhydride Alternating Copolymers as Single–Layer Photoresists for 193 nm Photolithography", *Proceedings of the SPIE*, vol. 2724, pp. 355–364 (1996).

* cited by examiner

*Primary Examiner*—Peter D. Mulcahy
*Assistant Examiner*—Tanya Zalukaeva
(74) *Attorney, Agent, or Firm*—Jacobson Holman, PLLC

(57) ABSTRACT

A novel copolymer useful for photoresist, which allows a formation of patterns showing a significantly improved resolution in a photolithography using ArF (193 nm) light source, is prepared by copolymerizing at least two cycloaliphatic olefins with an amide or imide.

4 Claims, 3 Drawing Sheets

AMIDE- OR IMIDE-INTRODUCED COPOLYMER, PREPARATION THEREOF AND A PHOTORESIST COMPRISING THE SAME

BACKGROUND OF THE INVENTION

1. Field of the Invention

The present invention relates to a novel amide- or imide-introduced copolymer useful as a photoresist resin in a lithography process using a light source suitable for forming a fine pattern of a highly integrated semiconductor device, a method for preparing the same, and a photoresist comprising the same.

2. Description of the Prior Art

To achieve high sensitivity in a microlithography for fabricating a semiconductor device, deep ultra violet (DUV) photoresist, a chemical amplification resist, has been the most extensively used recent times. Its composition comprises a photoacid generator and a matrix polymer reacting sensitively to acid.

Ideal photoresist is to satisfy such requirements as transparency to ArF light source, etch resistance, developability in 2.38% tetramethyl ammonium hydroxide (TMAH) and adhesiveness. However, it is very difficult to synthesize a photoresist resin superior in all of the requirements.

For example, a resin having a polyacrylate as a main chain is easy to synthesize but problematic in etch resistance and development. The etch resistance can be increased by introducing aliphatic ring moieties into the main chain.

Although the main chain is of polyacrylate type, with or without on aliphatic ring, problems still remain. The basic principle in the development of the photoresist film used for forming fine patterns of a semiconductor device resides in the formation of carboxylic acid by the photoacid generator. Because carboxylic acid is better dissolved in 2.38% TMAH than in hydroxy phenol, a solution used for KrF, the thereby produced pattern has a significant problem in that it has a round rather than a rectangular upper portion.

In addition, to overcome the phenomenon that an ArF light source alters the properties of the lens material, a pattern must be formed at a low level of energy because of the high sensitivity to light. To this end, either the amount of the photoacid generator in the photoresist composition or the carboxylic acid content of the photoresist resin must be increased.

Designed as it has been, the prior art solves to both of the above problems be cause the patterns have a round rather than a rectangular upper portion, making it virtually impossible to obtain a pattern of high resolution.

SUMMARY OF THE INVENTION

A primary objective of the present invention is to overcome the above problems encountered in prior arts and to provide a novel copolymer useful for photoresist, which allows a formation of patterns having a rectangular rather than a round upper portion, and shows a significantly improved resolution, as well as being superior in etch resistance, thermal resistance and adhesiveness.

An another objective of the present invention is to provide a method for preparing the novel copolymer.

A further objective of the present invention is to provide a photoresist comprising the novel copolymer.

In accordance with an aspect of the present invention, there is provided a copolymer, prepared by copolymerizing at least two cycloaliphatic olefins with an amide or imide.

In accordance with another aspect of the present invention, a method for preparing a copolymer for photoresist is provided and comprises copolymerizing at least two cycloaliphatic olefins with an amide or imide at a temperature of about 60–200° C. and at a pressure of about 50–200 atm.

In accordance with a further aspect of the present invention, a photoresist is provided and comprises a copolymer prepared from at least two cycloaliphatic olefins and an amide or imide.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1A:
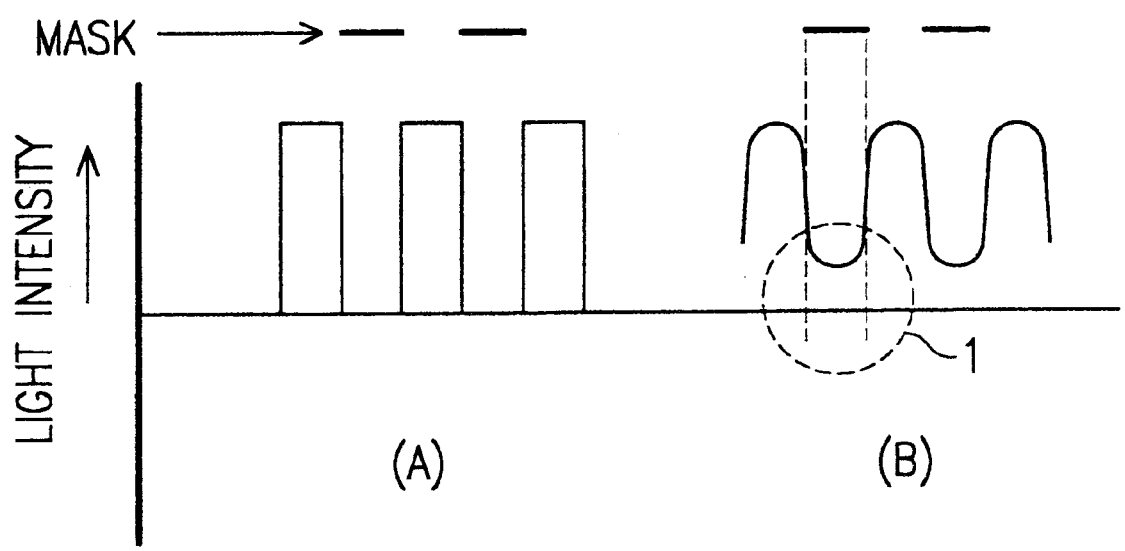
FIG. 1 schematically shows an ideal pattern formation and a conventional pattern formation in practice when illuminating light.

The present invention contemplates a polymer useful for photoresist, which is a copolymer prepared from at least two cycloaliphatic olefins and an amide or imide.

Preferred examples of the cycloaliphatic olefin moiety include vinylene carbonate, 2-cyclopentene-1-acetic acid, 2-cyclopentene-1-(t-butyl acetate), bicyclo[2,2,2]oct-5-ene-2-t-butyl carboxylate, bicyclo[2,2,2]oct-5-ene-2-carboxylic acid, bicyclo[2,2,2]oct-5-ene-2-(2-hydroxyethyl) carboxylate, 2-(2-hydroxyethyl)carboxylate-5-norbornene, 2-t-butyl carboxylate-5-norbornene, 2-carboxylic acid-5-norbornene, cyclopentene, cyclohexene, norbornylene, and norbornylene-2-methanol, whose structural formula I are represented as follows:

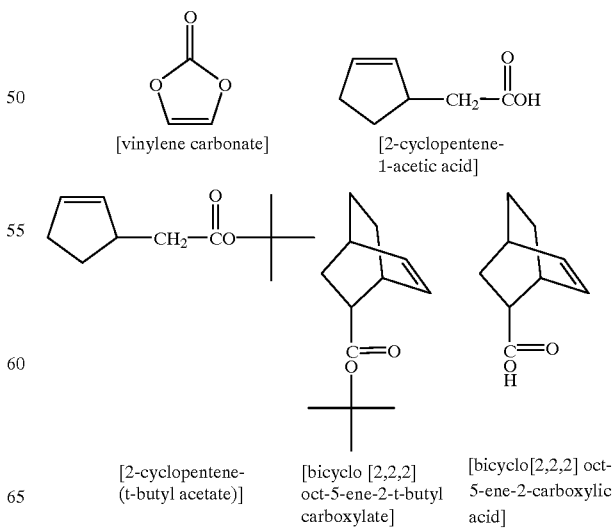

-continued

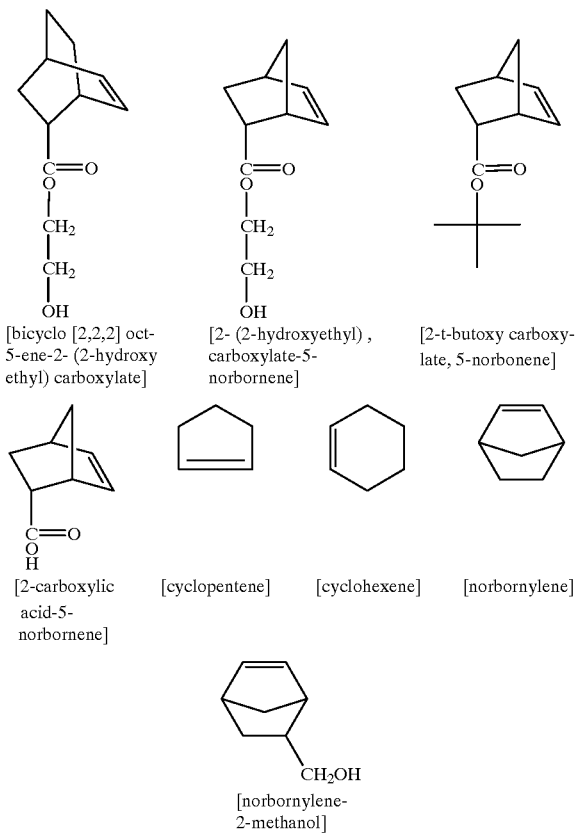

Preferred examples of the amide or imide source for the copolymer of the present invention include N-methylmaleimide, maleimide, N-ethylmaleimide, N-butylmaleimide, N-t-butylmaleimide, N-hydroxymaleimide, acrylamide, N,N-dimethylacrylamide, and N-isopropylacrylamide, whose structural formula II are represented as follows:

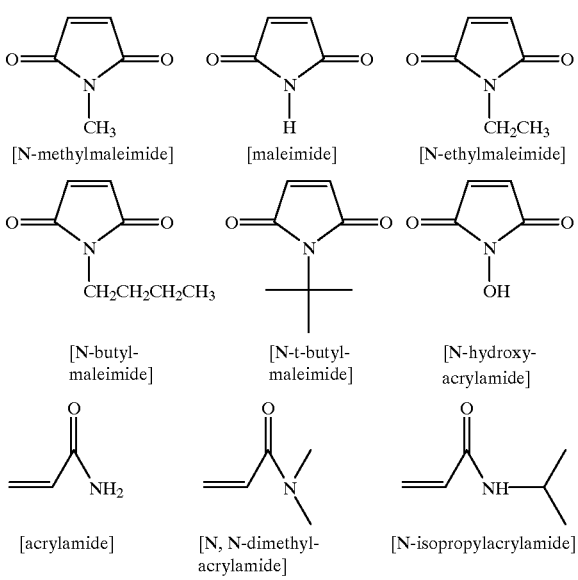

The copolymer of the present invention preferably has a molecular weight of 3,000–200,000.

Such two cycloaliphatic olefins and an amide or imide can be polymerized at a high temperature under high pressure in the presence of a radical initiator. The polymerization can be achieved through bulk polymerization or solution polymerization. In this case, a polymerization solvent may be selected from a group consisting of cyclohexanone, methylethylketone, benzene, toluene, dioxane, dimethylformamide and the mixtures thereof.

For the polymerization, a conventional radical initiator may be used, which is selected from the group consisting of benzoyl peroxide, 2,2'-azobisisobutyronitrile (AIBN), acetyl peroxide, lauryl peroxide, t-butylperacetate, t-butyl peroxide, and di-t-butyl peroxide.

The condition for the polymerization may vary depending on the properties of the reactant monomers. Preferably, the reaction is carried out at a temperature of 60–200° C. and at a pressure of 50–200 atm.

A typical manner can be applied for mixing the novel photoresist copolymer of the present invention with a photoacid generator in an organic solvent to form a photoresist solution useful for the formation of a positive fine picture image.

Depending on the organic solvent, the photoacid generator, the lithography condition and the amount of the novel copolymer used may vary. Usually, it is used at an amount of about 10–30% of the total weight of the organic solvent.

A detailed description will be given of the formation of photoresist from the copolymer according to the present invention.

First, the copolymer of the present invention is dissolved at an amount of 10–30% of the weight of an organic solvent, e.g. cyclohexanone to which a photoacid generator, e.g. onium salt or organic sulfonium salt, is added at an amount of about 0.1–10% of the weight of the resist polymer. The resulting solution is filtered through an ultra fine filter, to give a photoresist solution.

Next, the photoresist solution is spin-coated on a silicon wafer and then, soft-baked at a temperature of 80–150° C. for 1–5 min in an oven and heat plate.

Subsequently, using a deep ultra violet stepper or excimer laser stepper, a proper beam is illuminated on the coating which is, then, subjected to post-baking at a temperature of 100–200° C.

Following this, the exposed wafer is immersed in a 2.38% TMAH aqueous solution for 1.5 min, to obtain an ultra fine positive resist picture image.

Since the novel copolymer for photoresist has a main chain from which the amide or imide moieties dangle directly, they do not move even after the post-baking.

Figure 2:
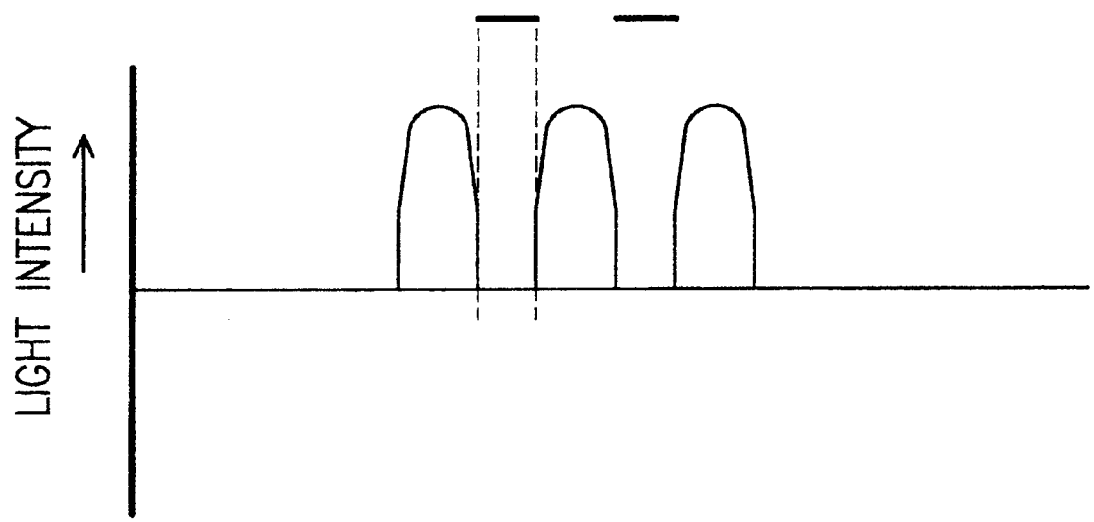
FIG. 2 schematically shows a pattern formation by use of the copolymer according to the present invention.

Upon the post-baking, since the amount of the acid is sufficiently more than that of the amide or imide at the photoresist film layer of the quartz part which receives light, the acid diffuses thereat. In contrast, at the photoresist film layer of the chrome part which is insufficiently exposed to the light, the diffusion of the acid is restrained by the amide or imide, giving the same effect as shown in FIG. 2. As a result, the resolution of the pattern is increased considerably.

The amide or imide moieties attached directly to the main chain of the photoresist polymer of the present invention, although absorbing ArF light, does not have a deleterious influence on the pattern formation because it is used at a smaller amount than the photoacid generator.

EXAMPLE

Synthesis of the Copolymer

Equi-moles of 2-(2-hydroxyethyl) carboxylate-5-norbornene, 2-t-butoxy carboxylate-5-norbornene and 2-carboxylic acid-5-norbornene and N-methylmaleimide were subjected to a polymerization reaction under a nitrogen atmosphere in a high pressure reactor in the presence of di-t-butylperoxide, an initiator. This polymerization was carried out at various pressures, e.g. 50, 60, 70, 80, 90 and 100 atm. A production yield of about 40% was obtained at a pressure of about 80 atm while a yield of about 60% at a pressure of about 100 atm.

As described hereinbefore, the novel amide- or imide-introduced copolymer according to the present invention allows the photoresist to be formed into a pattern having rectangular upper parts rather than round ones, upon the development of TMAH, giving rise to an increase in resolution.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A photoresist copolymer wherein the copolymer is a poly.

2. A photoresist poly copolymer.

3. A photoresist copolymer according to claim 1 which is a poly.

4. A photoresist copolymer consisting essentially of monomers, which are 2-(2-hydroxyethyl) carboxylate-5-norbornene, 2-t-butoxy carboxylate-5-norbornene, 2-carboxylic acid-5-norbornene and N-methylmaleimide.

* * * * *

UNITED STATES PATENT AND TRADEMARK OFFICE
CERTIFICATE OF CORRECTION

Figure 1B:
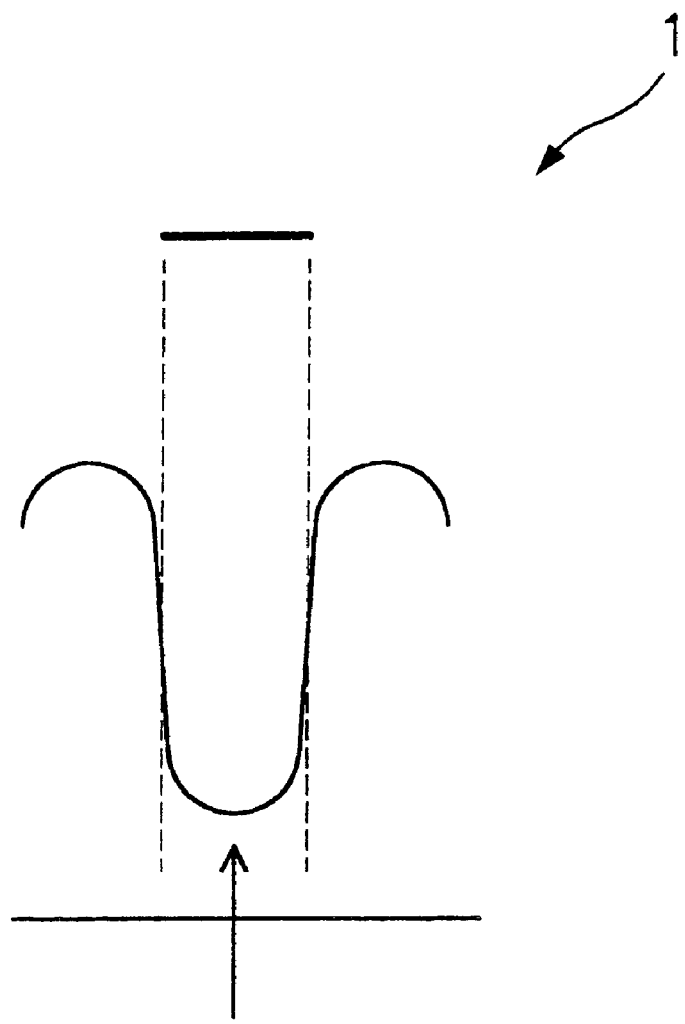

PATENT NO.    : 6,316,565 B1
DATED         : November 13, 2001
INVENTOR(S)   : Jae Chang Jung and Chi Hyeong Roh It is certified that error appears in the above-identified patent and that said Letters Patent is hereby corrected as shown below:

Column 2,
Lines 15-19, Existing lines 15-19 are replaced with the following:
  Fig. 1a schematically shows an ideal pattern formation (A) and a conventional pattern formation in practice (B) when illuminating light;

Fig. 1b shows an enlarged view of 1; and

Fig. 2 schematically shows a pattern formation by use of the copolymer according to the present invention.

Column 6,
Line 8, Existing claims 1-4 are replaced with the following:
  1. A photoresist copolymer wherein the copolymer is a poly [2- (2-hydroxyethyl) carboxylate-5-norbornene/2-t-butoxy carboxylate-5-norbornene/2-carboxylic acid-5-norbornene/N-methylmaleimide].

2. A photoresist poly [2- (2-hydroxyethyl) carboxylate-5-norbornene/2-t-butoxy carboxylate-5-norbornene/2carboxylic acid-5-norbornene/N-methylmaleimide] copolymer.

3. A photoresist copolymer according to claim 1 which is a poly [2- (2-hydroxyethyl) carboxylate-5-norbornene/2-t-butoxy carboxylate-5-norbornene/2-carboxylic acid-5-norbornene/N-methylmaleimide].

4. A photoresist copolymer essential monomeric components of which are [2- (2-hydroxyethyl) carboxylate-5-norbornene, 2-t-butoxy carboxylate-5-norbornene, 2-carboxylic acid-5-norbornene and N-methylmaleimide].

Signed and Sealed this

Twenty-fifth Day of June, 2002

*Attest:*

JAMES E. ROGAN
*Attesting Officer*     Director of the United States Patent and Trademark Office